US012579342B2

(12) United States Patent
Tang et al.

(10) Patent No.: US 12,579,342 B2
(45) Date of Patent: Mar. 17, 2026

(54) LOUDSPEAKER FRAME, LOUDSPEAKER AND MOUNTING SIMULATION ANALYSIS METHOD THEREFOR

(71) Applicant: SUZHOU SONAVOX ELECTRONICS CO., LTD., Suzhou (CN)

(72) Inventors: Jianfeng Tang, Suzhou (CN); Xiafeng Xue, Suzhou (CN); Xiaofeng Ding, Suzhou (CN)

(73) Assignee: SUZHOU SONAVOX ELECTRONICS CO., LTD., Suzhou (CN)

( * ) Notice: Subject to any disclaimer, the term of this patent is extended or adjusted under 35 U.S.C. 154(b) by 993 days.

(21) Appl. No.: 17/773,125

(22) PCT Filed: Nov. 4, 2020

(86) PCT No.: PCT/CN2020/126342
§ 371 (c)(1),
(2) Date: Apr. 29, 2022

(87) PCT Pub. No.: WO2021/088837
PCT Pub. Date: May 14, 2021

(65) Prior Publication Data
US 2022/0405444 A1     Dec. 22, 2022

(30) Foreign Application Priority Data

Nov. 5, 2019   (CN) .......................... 201911068471.5
Nov. 5, 2019   (CN) .......................... 201921888282.8

(51) Int. Cl.
*G06F 30/23*      (2020.01)
*H04R 1/02*       (2006.01)

(52) U.S. Cl.
CPC ............. *G06F 30/23* (2020.01); *H04R 1/025* (2013.01); *H04R 2400/11* (2013.01)

(58) Field of Classification Search
CPC ...... G06F 30/23; G06F 2119/14; G06F 30/17; G06F 30/25; G06F 30/367; G06F 30/398;
(Continued)

(56) References Cited

FOREIGN PATENT DOCUMENTS

CN        110889175 A      3/2020
CN        210298075 U      4/2020
(Continued)

OTHER PUBLICATIONS

International Search Report issued in International Patent Application No. PCT/CN2020/126342; mailed Dec. 30, 2020; 7 pgs.

*Primary Examiner* — Rehana Perveen
*Assistant Examiner* — Troy A Maust
(74) *Attorney, Agent, or Firm* — HAUPTMAN HAM, LLP

(57)          ABSTRACT

Disclosure is a loudspeaker frame, comprising a frame body, and a fastener for mounting the frame body in an application scenario. The fastener comprises a connecting column having a proximal end being directly or indirectly connected to the frame body and a distal end; and fins arranged in pairs and respectively located on two sides of the connecting column, wherein each of the fins has a proximal end and a distal end. The distal end of each of the fins is connected to the distal end of the connecting column, a gap is formed between the proximal end of each of the fins and the connecting column, and each of the fins has elasticity so as to allow the fin to draw close to the connecting column after being pressed.

15 Claims, 9 Drawing Sheets

(58) Field of Classification Search
CPC ..... G06F 30/12; H04R 1/025; H04R 2400/11;
H04R 2499/13
See application file for complete search history.

(56) References Cited

FOREIGN PATENT DOCUMENTS

| | | | | | |
|---|---|---|---|---|---|
| DE | 102019005713 | A1 | * | 2/2021 | .............. F21S 8/026 |
| FR | 3051310 | A3 | * | 11/2017 | .............. H04R 1/02 |

* cited by examiner

LOUDSPEAKER FRAME, LOUDSPEAKER AND MOUNTING SIMULATION ANALYSIS METHOD THEREFOR

CROSS REFERENCE TO RELATED APPLICATION(S)

This application is a U.S. National Phase of International Application Number PCT/CN2020/126342 filed Nov. 4, 2020, and claims priority from Chinese Patent Applications No. CN2019110684715 and No. CN2019218882828 filed on Nov. 5, 2019.

TECHNICAL FIELD

The present disclosure relates to the field of loudspeakers, in particular to a loudspeaker frame, a loudspeaker, and a method of simulation analysis for mounting the frame.

BACKGROUND

The main components of the loudspeaker comprise: a frame, a magnetic assembly and a vibration assembly. In some application scenarios, a loudspeaker is needed to be mounted on another object. For example, a vehicular loudspeaker is needed to be fixed to the vehicles. At present, a common loudspeaker mounting method is as follows: providing a fastener on the loudspeaker frame, and mounting the loudspeaker by snapping the fastener into another object. However, the allowable deformation and the drawing force of the existing fastener are small, the application range is narrow, and the weight of the loudspeaker that can be carried is low.

With the development of new technologies and new methods, in the process of loudspeaker's mounting, the requirements for reducing the difficulty of mounting by workers, simplifying mounting procedures for workers and improving mounting efficiency are getting higher and higher. At the same time, for the loudspeaker manufacturing itself, the requirements for reducing the cost of components and simplifying the assembly procedure of loudspeaker parts are becoming higher and higher.

SUMMARY

In view of the above problems, the present disclosure provides a loudspeaker frame and a loudspeaker, of which the fastener has a large deformation and a large drawing force in need thereof, and can prevent the loudspeaker from falling off after being mounted. The present disclosure further provides a mounting simulation analysis method for a loudspeaker frame, which can obtain the stress of the fastener of the frame at any point in the process of being snapped in or pulled out, and then judge whether the snapping-in and pulling-out effects of the fastener meet the requirements.

A loudspeaker frame comprises a frame body, and a fastener for mounting the frame body in an application scenario;

wherein the fastener comprises:

a connecting column having a proximal end being directly or indirectly connected to the frame body and a distal end; and fins arranged in pairs and respectively located on two sides of the connecting column, wherein each of the fins has a proximal end and a distal end, and distance between the proximal end of each of the fins and the frame body is less than distance between the distal end of each of the fins and the frame body;

wherein the distal end of each of the fins is connected to the distal end of the connecting column, a gap is formed between the proximal end of each of the fins and the connecting column, and each of the fins has elasticity so as to allow the fin to draw close to the connecting column after being pressed.

In some embodiments, an upper surface of each of the fins is provided with a snapping-in guiding slope for facilitating a snapping-in of the fastener, and the snapping-in guiding slope is gradually inclined upward from the distal end to the proximal end of the fin.

In some embodiments an upper surface of each of the fins is further provided with a pulling-out guiding slope, and the pulling-out guiding slope is gradually inclined downward from the distal end to the proximal end of the fin.

In some embodiments, an inclination angle of the snapping-in guiding slope is smaller than an inclination angle of the pulling-out guiding slope.

In some embodiments, each of the fins is in a shape of a sheet with a middle portion bent upwards as a whole.

In some embodiments, the proximal end of each of the fins is located on one side of the connecting column when not being compressed, and the proximal end of each of the fins is flush with the connecting column or is located on the other side of the connecting column after being compressed.

In some embodiments, the fastener is one, the fins are two, and the two fins are symmetrically arranged.

In some embodiments, the fastener is integrally formed with plastic.

In some embodiments, the proximal end of the connecting column is fixedly connected to the frame body.

A loudspeaker, comprises the loudspeaker frame mentioned above.

A method of simulation analysis for mounting a loudspeaker frame as described above, comprises snapping-in analysis steps and pulling-out analysis steps;

the snapping-in analysis steps comprises:

A—building a first geometric model according to the fastener of the loudspeaker frame and a structure of its mounting scenario, where the first geometric model is a geometric model in which the fastener is snapped in the mounting scenario;

B—building a first finite element model based on the first geometric model; and

C—solving and post-processing the first finite element model to obtain the stress distribution in the process of the fastener being clipped into the mounting scenario;

the pulling-out analysis steps comprises:

a—building a second geometric model according to the fastener and the structure of its mounting scenario, where the second geometric model is a geometric model in which the fastener is pulled out from the mounting scenario;

b—building a second finite element model based on the second geometric model; and c—solving and post-processing the second finite element model to obtain stress distribution during the fastener being pulled out from the mounting scenario;

wherein, in the step C and the step c, a surface friction is used when solving, and the surface friction is based on the following theoretical equations:

$$f=\mu_1 \times N; F=\mu_2 \times N$$

wherein, f is friction force, $\mu 1$ is dynamic friction factor, N is positive pressure; F is maximum static friction force of the positive pressure, and $\mu 2$ is static friction factor;

the method further comprises adjusting parameters of the fastener of the loudspeaker frame according to the snapping-in analysis steps and the pulling-out analysis steps.

In some embodiments, the step C and the step c respectively comprise:

setting a range of steady state study: the range of the first finite element model is 10^range(−1, 0.1, −0.5)*2 10^range(−0.45, 0.025, 0)*2, the range of the second finite element model is 10^range(−1, 0.005, 0)*2;

solving the first finite element model and the second finite element model based on the following theoretical equations:

$$[M]\{\ddot{X}\}+[C]\{\dot{X}\}+[K]\{X\}=\{F\}$$

wherein, [M] is mass matrix, [C] is damping matrix, [K] is static stiffness matrix, $\{\ddot{X}\}$ is nodal acceleration vector, $\{\dot{X}\}$ is nodal velocity vector, $\{X\}$ is nodal displacement vector, and $\{F\}$ is excitation load vector; and performing image processing or list display on the results of solving the first finite element model and the second finite element model.

In some embodiments, the step B specifically comprises:

B1—setting spatial dimension to three dimensions, selecting solid mechanics in structural mechanics for physical interface, and selecting steady state for study type;

B2—importing the first geometric model to form a union;

B3—defining parameters of movement mode;

B4—defining integral and contact pairs;

B5—setting material of the fastener and the mounting scenario in the first geometric model;

B6—setting boundary conditions and constraints;

B7—defining material parameters;

B8—dividing mesh to form the first finite element model.

In some embodiments, the step b specifically comprises:

b1—setting spatial dimension to three dimensions, selecting solid mechanics in structural mechanics for physical interface, and selecting steady state for study type;

b2—importing the second geometric model to form a union;

b3—defining parameters of movement mode;

b4—defining integral and contact pairs;

b5—setting material of the fastener and the mounting scenario in the second geometric model;

b6—setting boundary conditions and constraints;

b7—defining material parameters;

b8—dividing mesh to form the second finite element model.

In some embodiments, the defined parameters of the movement mode are specifically: rotation radius rr=0.252095[m], initial angle phi0=(a sin(0.007936794664 [m]/rr)); and/or defining integral and contact pairs is specifically: integrating the acting surface of an external force in the process of snapping in or pulling out, and setting the positions of the fastener and the mounting scenario where may come into contact during the process of snapping in or pulling out as a pair of contact pairs; and/or the material of the fastener and the mounting scenario are specifically: the material of the fastener is polypropylene plastic, and the material of the mounting scenario is steel; and/or setting boundary conditions and constraints is specifically: setting the boundary of the mounting scenario as a fixed constraint boundary, specifying a displacement on the fastener, using the set contact pairs to set friction, building the first geometric model by taking half of the fastener along its symmetry plane, and setting the model face that coincides with the symmetry plane as a symmetry boundary; and/or defining material parameters is specifically: setting Young's modulus, density and Poisson's ratio of the material; and/or dividing mesh is specifically: adopting a free tetrahedral mesh type and setting a customized mesh for the contact surface to refine the mesh.

In a preferred embodiment, the fastener is a plastic special-shaped fastener, and the mounting scenario is a mounting plate. The metal fasteners, which were originally used as separate parts, are designed as plastic fasteners integrated with the loudspeaker to reduce the number of parts, reduce the assembly procedures and assembly personnel of the loudspeaker, and at the same time ensure a reasonable snapping-in force and retention force, which is convenient to reduce the difficulty during loading, simplify the procedure and even provide a reasonable parameter range for the robot to install the loudspeaker.

Due to the use of the above solutions, the present disclosure has the following advantages over the prior art:

in the loudspeaker frame of the present disclosure, after being squeezed, the fins have a large deformation, the application range is wide, and the mounting process requirements are relatively low; and the push-in force required for mounting is small, and the pulling-out force after mounting is large, which can prevent the loudspeaker from falling after mounted, and can support the loudspeaker with large weight.

In the method of simulation analysis for mounting of the present disclosure, there is no need to make samples with fasteners in advance, and by using the numerical simulation analysis method, the changes of the stress, strain, snapping-in force and pulling-out force at any point on the system can be calculated by analyzing the models of the snapping-in and pulling-out processes of the fastener, and then it can be judged whether the snapping-in meets the requirements of strength, toughness, snapping-in force, pulling-out force, etc., so as to adjust the parameters (size, material, etc.) of the loudspeaker frame accordingly, so as to greatly improve the design efficiency, and save costs of research and development as well as time.

BRIEF DESCRIPTION OF THE DRAWINGS

For more clearly explaining the technical solutions in the embodiments of the present disclosure, the accompanying drawings used to describe the embodiments are simply introduced in the following. Apparently, the below described drawings merely show a part of the embodiments of the present disclosure, and those skilled in the art can obtain other drawings according to the accompanying drawings without creative work.

wherein,

100—loudspeaker; 10—loudspeaker frame; 1—frame body; 2—fastener; 200—mounting plate;

21—connecting column; 211—proximal end; 212—distal end;

22—fin; 221—proximal end; 222—distal end; 223—snapping-in guiding slope; 224—pulling-out guiding slope.

DETAILED DESCRIPTION

In the following, the preferable embodiments of the present disclosure are explained in detail combining with the accompanying drawings so that the advantages and features of the present disclosure can be easily understood by the skilled persons in the art. It should be noted that the explanation on these implementations is to help understanding of the present disclosure, and is not intended to limit the present disclosure.

Figure 4:
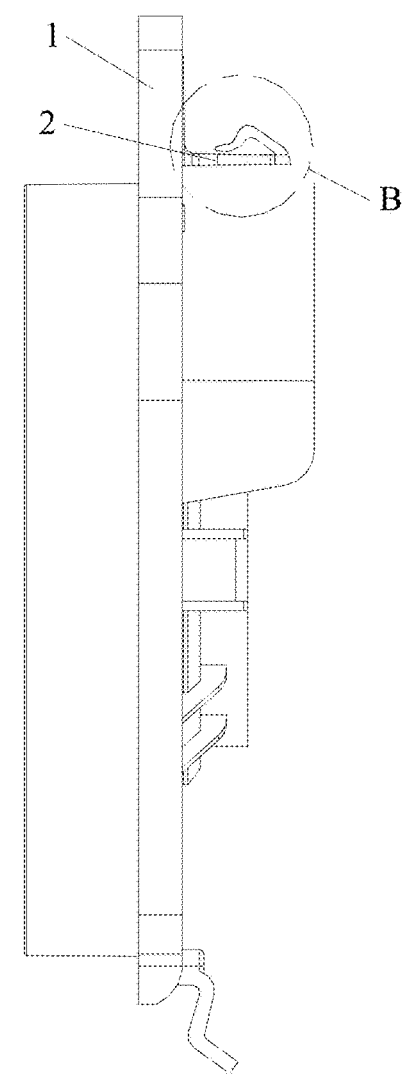
FIG. 4 is a side view of the loudspeaker shown in FIG. 1.

Upper and lower mentioned in the present disclosure are defined according to view of general consumers and for the convenience of description, and do not limit the specific directions. When the consumer faces the front of the loudspeaker, in the side view shown in FIG. 4, the upper side of the paper is "upper", and the lower side of the paper is "lower".

Referring to FIGS. 1 to 5, the present embodiment provides a loudspeaker frame 10 and a loudspeaker 100 having the loudspeaker frame 10. The loudspeaker frame 10 comprises a frame body 1, and a fastener 2 for mounting the frame body 1 in an application scenario. The frame body 1 provides support for other components of the loudspeaker 100, such as a vibration system, a magnetic system, and the like. A specific application scenario of this embodiment is a vehicle, the loudspeaker 100 is specifically a vehicular loudspeaker, and the loudspeaker 100 is mounted on the vehicle through the fastener 2 on the loudspeaker body.

Figure 1:
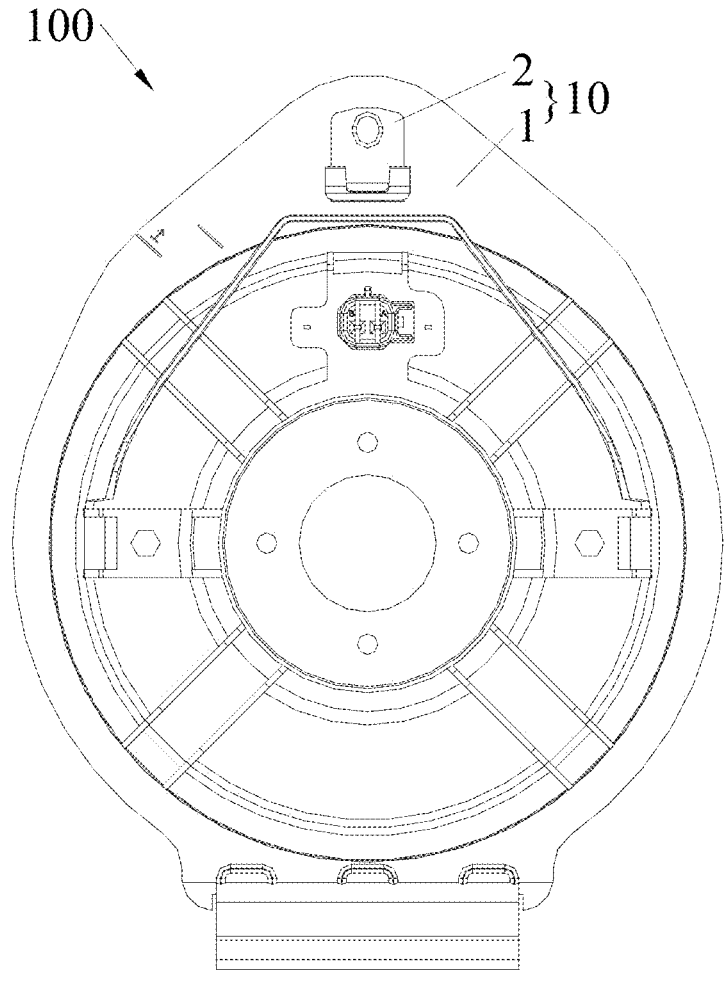
FIG. 1 is a schematic structure diagram of a loudspeaker of an embodiment of the present disclosure.
Figure 2:
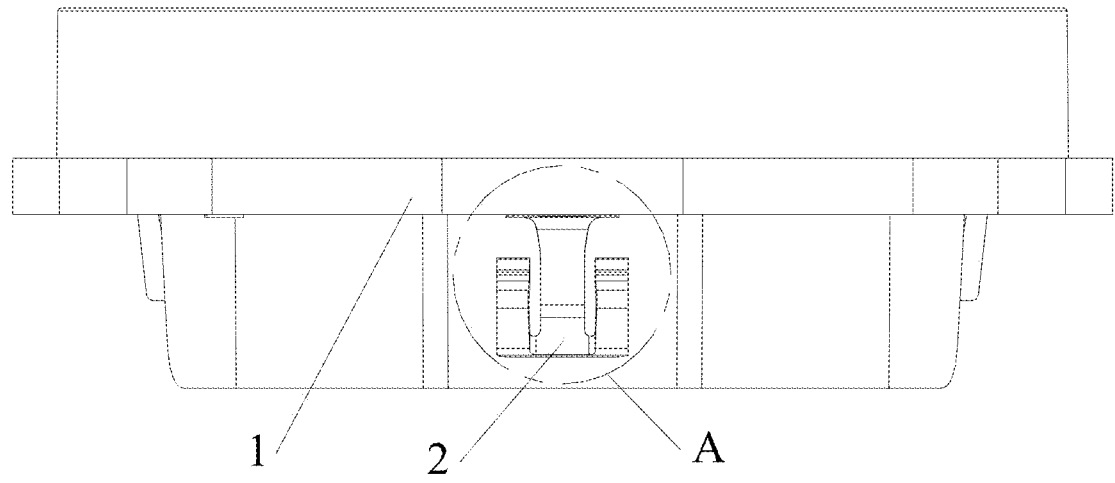
FIG. 2 is a top view of the loudspeaker shown in FIG. 1.
Figure 3:
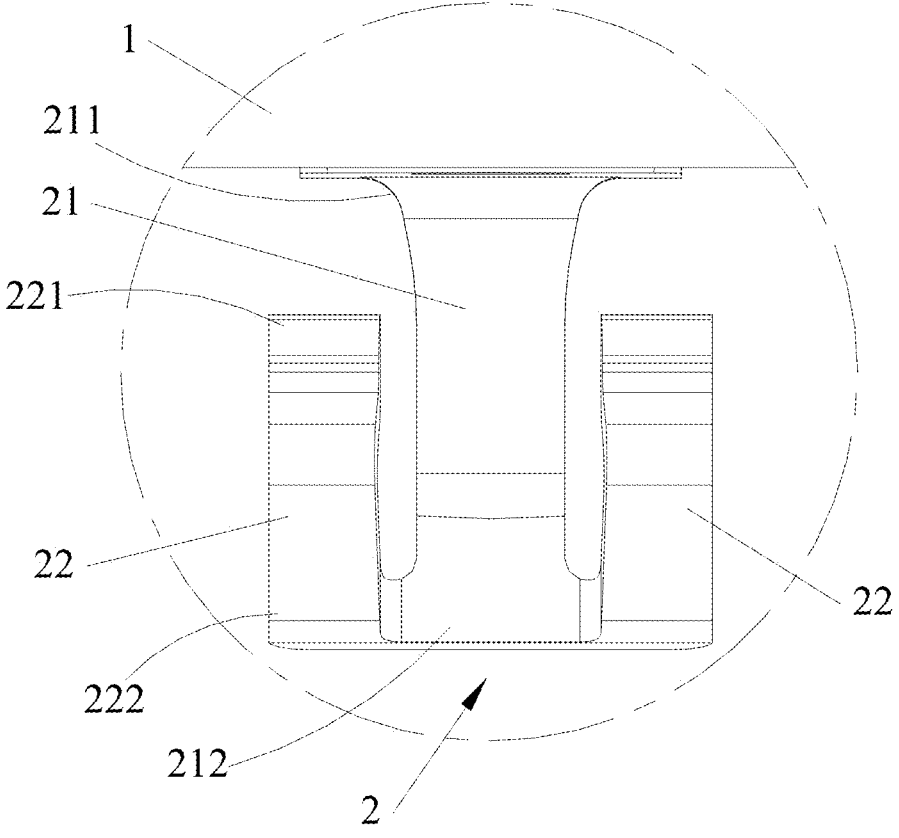
FIG. 3 is a partial enlarged view of Part A in FIG. 2.
Figure 5:
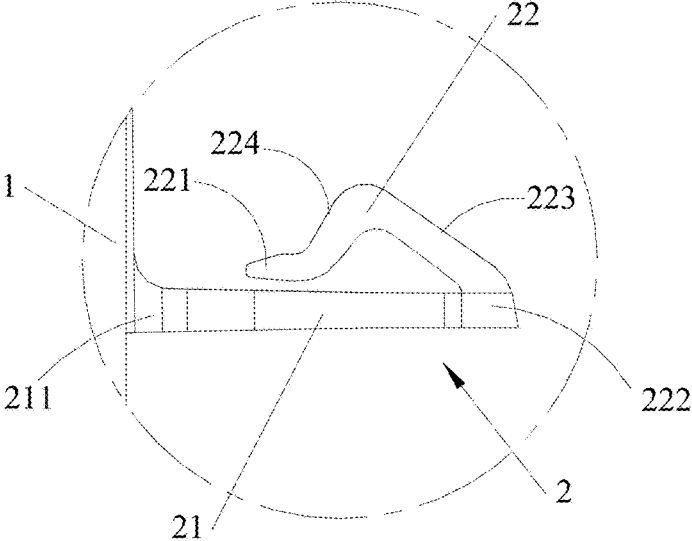
FIG. 5 is a partial enlarged view of Part B in FIG. 4.

As shown in FIG. 3 and FIG. 5, the fastener 2 comprises a connecting column 21 and fins 22 arranged in pair. In this embodiment, the number of fins 22 is two, that is, the fastener 2 only comprises a pair of fins 22, and the two fins 22 are symmetrically arranged, as shown in FIG. 3. The connecting column 21 has a proximal end 211 and a distal end 212, the proximal end 211 of the connecting column 21 is directly or indirectly connected with the frame body 1, each fin 22 has a proximal end 221 and a distal end 222 respectively, and the distance between the proximal end 221 of each fin 22 and the frame body 1 is smaller than the distance between the distal end 222 of each fin 22 and the frame body 1. Herein, the proximal end refers to the end of the component that is closer to the frame body 1, and the opposite end is the distal end.

The above pair of fins 22 is respectively located on two sides of the connecting column 21, and the distal end 22 of each fin 22 is connected to the distal end 212 of the connecting column 21, a gap is formed between the proximal end 221 of each fin 22 and the connecting column 21, and each fin 22 has elasticity so as to allow the fin to draw close to the connecting column 21 after being pressed. At the beginning, the proximal end 221 of each fin 22 is located on one side of the connecting column 21; after being compressed, the proximal end 221 of each fin 22 is flush with the connecting column 21 or is located on the other side of the connecting column 21. Specifically, as shown in FIG. 3, the above-mentioned pair of fins 22 are located on the left and right sides of the connecting column 21 respectively, and the spacing between the fins 22 is greater than the width of the connecting column 21, so that the fins 22 are spaced apart from the connecting column 21 in the left-right direction. As shown in FIG. 5, when not being compressed, the proximal end 221 of each fin 22 is higher than the connecting column 21, so that the fins 22 are spaced apart from the connecting column 21 in the up-down direction; after being compressed, the height difference between the proximal end 221 of each fin 22 and the connecting column 21 decreases, and the proximal ends 221 of the fins 22 are gradually flush with the connecting column 21, and even is lower than the connecting column 21.

The fins are in the shape of a sheet with the middle part bent upwards as a whole. The upper surface of each fin 22 has a snapping-in guiding slope 223 for facilitating the snapping-in of the fastener 2, and the snapping-in guiding slope 223 is gradually inclined upward in the direction from the distal end 222 to the proximal end 221 of the fin 22. The upper surface of each fin 22 has a pulling-out guiding slope 224, and the pulling-out guiding slope 224 is gradually inclined downward in the direction from the distal end 222 to the proximal end 221 of the fin 22. The inclination angle of the snapping-in guiding slope 223 is smaller than the inclination angle of the pulling-out guiding slope 224. The inclination angle herein refers to the angle between the snapping-in guiding slope 223 or the pulling-out guiding slope 224 and the length direction of the connecting column 21, and specifically, in this embodiment, the length direction of the connecting column 21 is the horizontal direction, and the above-mentioned inclination angle is the angle between the snapping-in guiding slope 223 or the pulling-out guiding slope 224 and the horizontal plane. In addition, the snapping-in guiding slope 223 is disposed outer side the pulling-out guiding slope 224, that is, the pulling-out guiding slope 224 is closer to the frame body 1 than the snapping-in guiding slope 223. The upper surface of the proximal end 221 is also inclined, and the inclination angle thereof is smaller than the inclination angle of the pulling-out guiding slope 224. After the fastener 2 is snapped in the mounting plate, the upper surface of the proximal end 221 or the pulling-out guiding slope 224 abuts against the hole wall of the mounting plate.

Since the fastener 2 of the above structure is adopted, the number of the fastener 2 in this embodiment is only one. That is to say, the loudspeaker 100 can be stably mounted in an application scenario (such as a vehicle) through one single fastener 2. The fastener 2 is integrally formed with plastic, and the fins 22 can be deformed by the properties of the plastic itself. The proximal end 211 of the connecting column 21 is fixedly connected with the frame body 1. The mounting process of the loudspeaker 100 is as follows: the distal end of the fastener 2 of the loudspeaker frame 10 faces the loudspeaker mounting hole in the application scenario, and is gradually snapped in the loudspeaker mounting hole, the fins 22 are deformed by the squeezing of the hole wall, and are close to the connecting column 21; after entering the loudspeaker mounting holes, the fins 22 are reset, so as to be stably locked on the application scenario.

In the loudspeaker frame mentioned above, after being squeezed, the proximal ends of fins are pressed from the upper side of the connecting column to the lower side of the connecting column, and have a large deformation, the application range is wide, and the mounting process requirements are relatively low; and the push-in force required for mounting is small, and the pulling-out force after mounting is large, which can prevent the loudspeaker from falling after mounted, and can support the loudspeaker with large weight.

Figure 6:
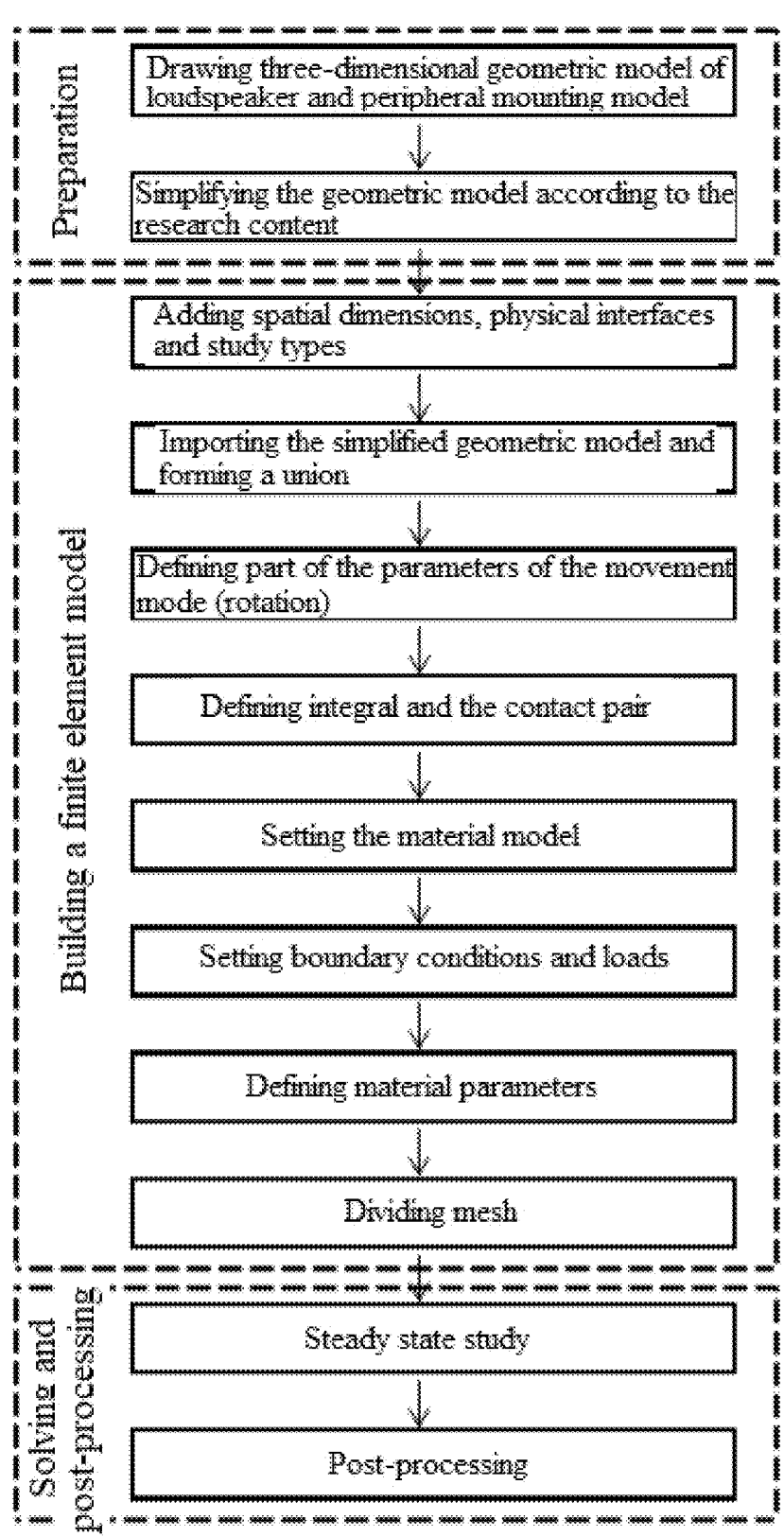
FIG. 6 is a flowchart of a mounting simulation analysis method of a loudspeaker frame of an embodiment of the present disclosure.

This embodiment also provides a method of simulation analysis for mounting a fastener, which is used to analyze the process of the fastener being snapped in a mounting scenario (such as a mounting plate on a vehicle) or the process of pulling it out from the mounting scenario, so as to judge whether the fastener meets the strength requirements and whether it is enough to stably mounting the loudspeaker in mounting scenario such as vehicle. FIG. 6 shows the process of the method, and the method of simulation analysis is consisted of snapping-in effect analysis and pulling-out effect analysis.

The snapping-in effect analysis comprises the following steps:

A—building a first geometric model according to the fastener and the structure of its mounting scenario, where the first geometric model is a geometric model in which the fastener is snapped in the mounting scenario;

B—building a first finite element model based on the first geometric model; and

C—solving and post-processing the first finite element model to obtain the stress distribution in the process of the fastener being snapped in the mounting scenario;

the pulling-out effect analysis comprises the following steps:

a—building a second geometric model according to the fastener and the structure of its mounting scenario, where the second geometric model is a geometric model in which the fastener is pulled out from the mounting scenario;

b—building a second finite element model based on the second geometric model; and c—solving and post-processing the second finite element model to obtain the stress distribution in the process of the fastener being pulled out from the mounting scenario.

Figure 7A:
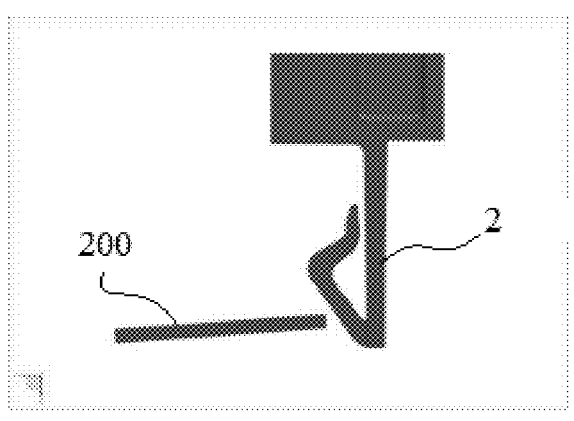
FIGS. 7*a* and 7*b* are schematic diagrams of a first geometric model and a second geometric model, respectively.
Figure 7B:

The geometric model that the fastener is snapped in the mounting scenario downward (i.e., the first geometric model) is shown in FIG. 7a, and the geometric model that the fastener is pulled upward from the mounting scenario (i.e., the second geometric model) is shown in FIG. 7b, which are produced by 3D drawing software, respectively.

In this embodiment, the fastener is a special-shaped fastener 2, and the mounting scenario is a mounting plate 200 in a vehicle.

Figure 8A:
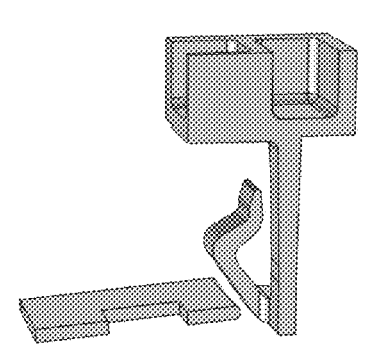
FIGS. 8*a* and 8*b* are schematic diagrams of a first geometric model and a second geometric model taken in half along the symmetry planes, respectively.
Figure 8B:
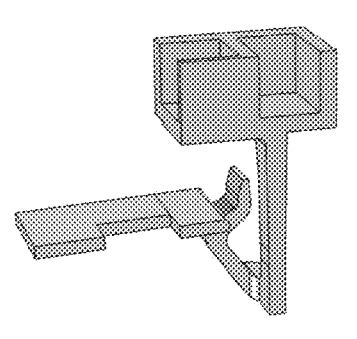

In this embodiment, the fastener and the mounting plate have symmetrical structures, so the analysis method takes half of the symmetrical fastener and the mounting plate along the symmetry plane to build a model, respectively forming the first geometric model of the snapping-in process shown in FIG. 8a and the second geometric model of the pulling-out process shown in FIG. 8b.

The specific process of the snapping-in effect analysis is described as follows.

(1) Preparation

A three-dimensional geometric model of the process of snapping the fastener in the mounting plate drawn by using a three-dimensional drawing software was used as the first geometric model for simulation analysis, as shown in FIG. 7a.

(2) Building a Finite Element Model

1) Adding spatial dimensions, physics field interfaces and study types. The COMSOL Multiphysics software was opened, the space dimension was set to "Three Dimensional", the physics field was selected to "Solid Mechanics", and the study type was selected to "Steady state".

2) Building a simplified geometric model of the snapping-in process of the fastener, as shown in FIG. 8a. The modeling process was as follows.

A—Importing the first geometric model: the operation related to "Geometry" was used to import the first geometric model, which comprised: the fastener and the fixed plate.

B—Geometry cleanup: the geometry cleanup function under the "Geometry" operation was used to clean up redundant dots, lines, surfaces and bodies in the model. And a union was formed. After importing the geometric model, the geometric cleanup function was used to remove the redundant dots, lines, surfaces and bodies in the model, and the rounded corner, etc. was adjusted, to improve the mesh quality.

3) Defining part of the parameters of the movement mode (rotation). This movement was the process of rotating and snapping. The rotation radius rr=0.252095[m], and the initial angle phi0=(a sin(0.007936794664 [m]/rr)).

4) Defining integral and the contact pair

A—The actual snapping-in process requires an external force, and in this simulation, an integral was defined on the action surface of the force (the upper end surface of the fastener in FIG. 8a), and "Summation at the Node" was adopted, and the reaction force during the snapping-in process of this surface was the required snapping-in force.

Figures 9A, 9B:
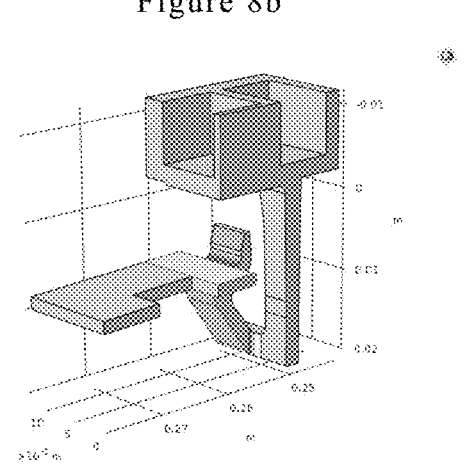
FIGS. 9*a* and 9*b* show the contact pairs and contact surfaces for the snapping-in and pulling-out processes of the fastener.

B—During the snapping-in process, the fastener and the fixed plate were in contact and slid, and the possible contacts were set as a pair of contact pair (the snapping-in guiding slope and the pulling-out guiding slope of the fastener, as shown in FIG. 9a).

5) Setting the material model. Under the "Solid Mechanics" physics field, the material model of the fastener and the fixed plate were set to "Linear Elastic Material". The fastener is made of PP material, and the fixed plate is made of structural steel.

6) Setting boundary conditions and loads. Under the "Solid Mechanics" physical field, boundary fixed constraints and specified displacements were set respectively, and the detailed setting steps are as follows.

A—Boundary fixed constraint: the fixed plate was set to "Fixed Constraint".

B—Specified displacement: on the surface shown in FIG. 8a, the snapping-in process loaded a displacement $$U0x=(sqrt(x^2+y^2)*sin(a\ tan(x/y)+phi0)-sqrt(x^2+y^2)*sin(a\ tan(x/y)),$$

$$U0y=sqrt(x^2+y^2)*cos(a\ tan(x/y)+phi0)-sqrt(x^2+y^2)*cos(a\ tan(x/y)),$$ the direction of displacement was counterclockwise along the z-axis.

C—Defining the contact: the contact pair in 4) was referred, the friction was set, the exponential dynamic Coulomb friction was used to calculate, and the static friction coefficient was 0.2.

Figures 10A, 10B, 11A, 11B, 12A, 12B:
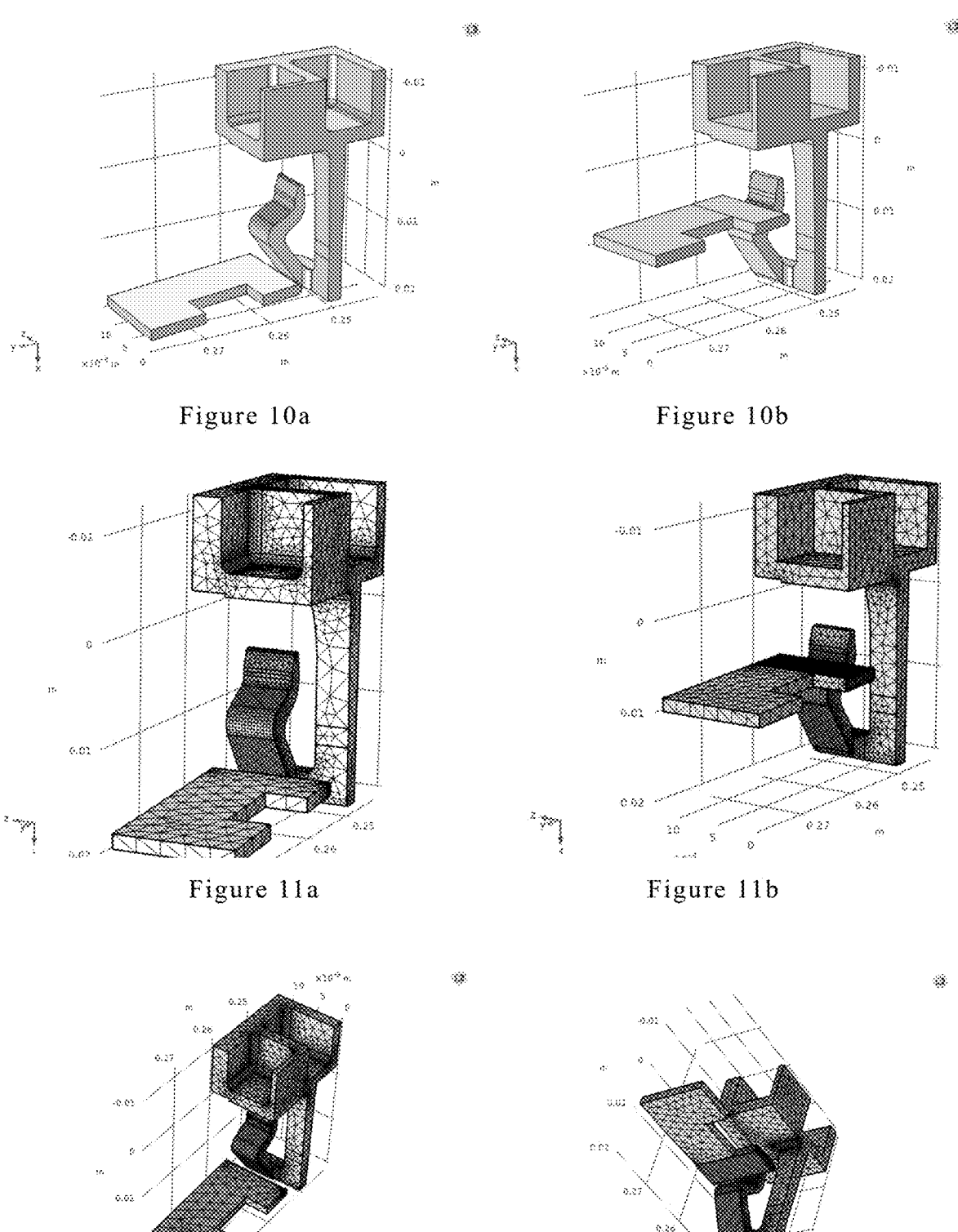
FIGS. 10*a* and 10*b* show the symmetry planes.
FIGS. 11*a* and 11*b* are schematic diagrams of a first finite element model and a finite element geometric model, respectively.
FIGS. 12*a* and 12*b* respectively show the first finite element model and the second finite element model after the contact mesh is refined.

D—Symmetrical plane setting: in this method, half of the symmetrical fastener was taken along the symmetrical plane to build a model, and the model plane that coincides with the symmetrical plane (as shown in FIG. 10a) was set as the symmetrical boundary.

7) Defining material parameters. the operations related to "Material" was used to set the material parameters of the geometric domains of the fastener and fixed plate in the model. The material parameters defined in this embodiment are shown in Table 1.

TABLE 1

|  | Density (Kg/m$^3$) | Young's modulus (Pa) | Poisson's ratio |
|---|---|---|---|
| Fastener | 1230 | 2.8e9 | 0.37 |
| Fixed plate | 7850 | 2e11 | 0.30 |

8) Dividing mesh. FIG. 11a and FIG. 12a are the finite element mesh models used in this embodiment, and the mesh division steps are as follows:

the mesh type of the fastener geometry domain was specified as "Free tetrahedral mesh", and the free tetrahedral mesh size was "customized": "refine" the mesh of the contact surface between the fastener and the fixed plate, and finally, "Build All" generated finite element meshes shown in FIG. 11a and FIG. 12a.

(3) Solving and Post-Processing

1) Steady state study.

A—Setting the solver: the range of the "steady state" study was set: 10^range(−1, 0.1, −0.5)*2 10^range(−0.45, 0.025, 0)*2, 10^range(−1, 0.005, 0)*2.

B—Calculation: after the setting was completed, the finite element model was solved, and the calculation process was realized by the built-in algorithm of COMSOL software. The process of solving involves surface friction, and the surface friction is based on the following theoretical equations:

$$f=\mu_1 \times N$$

$$F=\mu_2 \times N$$

wherein, f is the friction force, $\mu1$ is the dynamic friction factor, N is the positive pressure; F is the maximum static friction force of the positive pressure, and $\mu2$ is the static friction factor.

2) Post-processing. The results that can be viewed through post-processing are as follows.

Figures 13A, 13B, 14A, 14B:
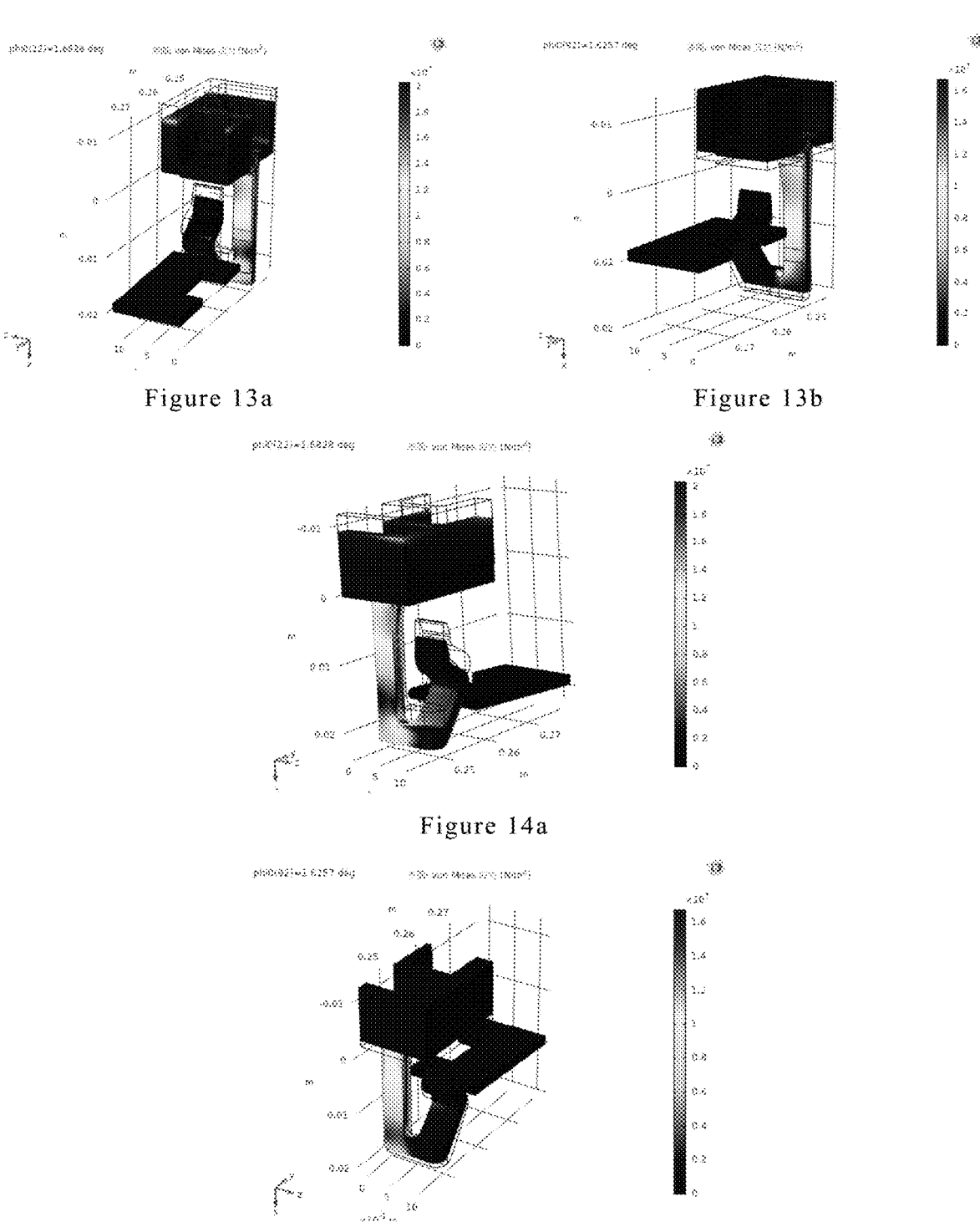
FIGS. 13*a* and 13*b* are stress distribution diagrams of the snapping-in and pulling-out processes, respectively.
FIGS. 14*a* and 14*b* are stress distribution diagrams of the snapping-in and pulling-out processes, respectively.

A—"Three dimensional drawing group" was added, "Body" draw was used, the expression solid.mises was input, the viewing parameter values were modified, and the stress distribution diagrams on the fastener during the snapping-in process were drawn, as shown in FIG. 13a and FIG. 14a. It can be seen from the figures that the design of the fastener meets the strength requirements, and there will be no fracture failure, but some parts such as the root of the fastener (the connecting portion between the fins and the connecting column) need to be strengthened.

Figure 15A:
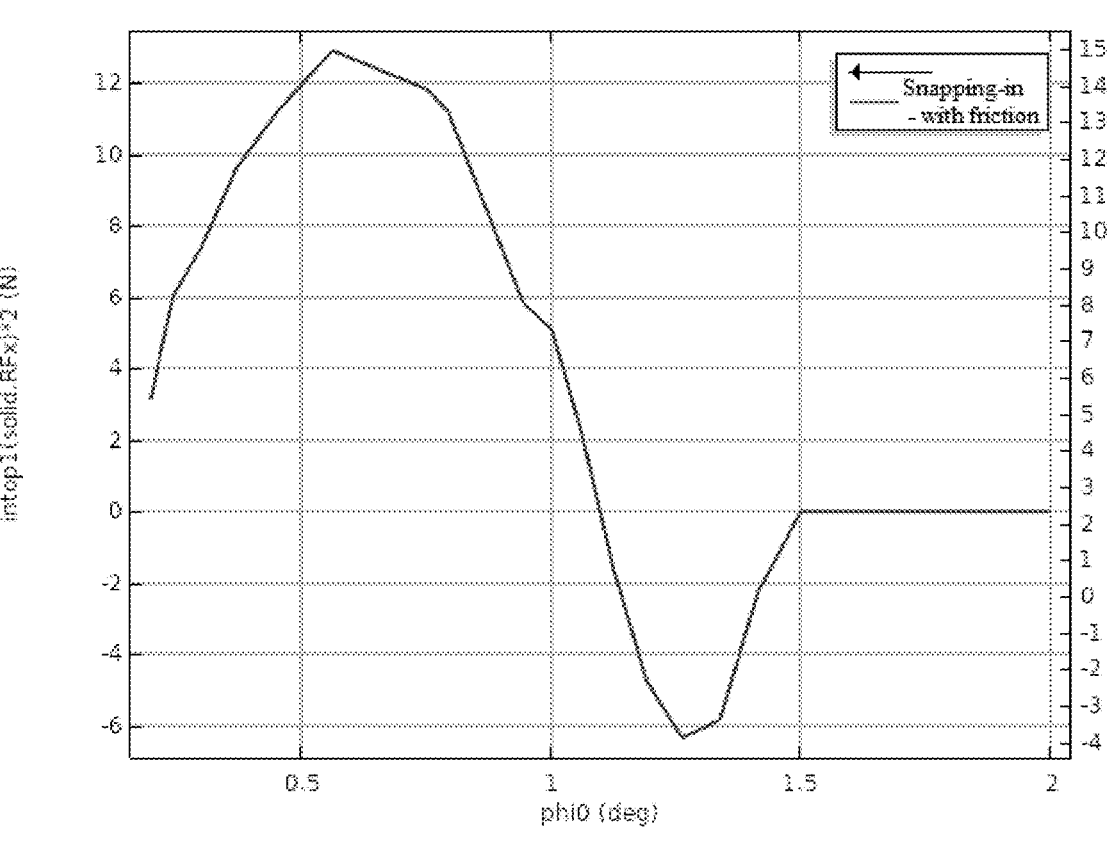
FIGS. 15*a* and 15*b* are graphs showing the change of reaction force in the snapping-in and pulling-out processes, respectively.

B—A "one-dimensional drawing group" was added, "Global" draw was used, and the relationship between the reaction force Y and the snapping-in displacement was drawn, as shown in FIG. 15a. The simulation results show that the design requirements are met.

The Specific Process of the Pulling-Out Effect Analysis is Described as Follows.

(1) Preparation

A three-dimensional geometric model of the process of pulling the fastener out from the mounting plate drawn by using a three-dimensional drawing software was used as the second geometric model for simulation analysis, as shown in FIG. 7b.

(2) Building a Finite Element Model

1) Adding spatial dimensions, physics field interfaces and study types. The COMSOL Multiphysics software was opened, the space dimension was set to "Three Dimensional", the physics field was selected to "Solid Mechanics", and the study type was selected to "Steady state".

2) Building a simplified geometric model of the pulling-out process of the fastener, as shown in FIG. 8b. The modeling process was as follows.

A—Importing the second geometric model: the operation related to "Geometry" was used to import the second geometric model, which comprised: the fastener and the fixed plate.

B—Geometry cleanup: the geometry cleanup function under the "Geometry" operation was used to clean up redundant dots, lines, surfaces and bodies in the model. And a union was formed. After importing the geometric model, the geometric cleanup function was used to remove the redundant dots, lines, surfaces and bodies in the model, and the rounded corners, etc. was adjusted, to improve the mesh quality.

3) Defining part of the parameters of the movement mode (rotation). The rotation radius rr=0.252095[m], and the initial angle phi0=(a sin(0.007936794664[m]/rr)).

4) Defining integral and the contact pair

A—The actual pulling-out process requires an external force, and in this simulation, an integral was defined on the action surface of the force (the upper end surface of the fastener in FIG. 8b), and "Summation at the Node" was adopted, and the reaction force during the pulling-out process of this surface was the required snapping-in force.

B—During the pulling-out process, the fastener and the fixed plate were in contact and slid, and the possible contacts were set as a pair of contact pair (the snapping-in guiding slope and the pulling-out guiding slope of the fastener, as shown in FIG. 9b).

5) Setting the material model. Under the "Solid Mechanics" physics field, the material model of the fastener and the fixed plate were set to "Linear Elastic Material". The fastener is made of PP material, and the fixed plate is made of structural steel.

6) Setting boundary conditions and loads. Under the "Solid Mechanics" physical field, boundary fixed constraints and specified displacements were set respectively, and the detailed setting steps are as follows:

A—Boundary fixed constraint: the fixed plate was set to "Fixed Constraint".

B—Specified displacement: on the surface shown in FIG. 8b, the pulling-out process loaded a displacement $$U0x=-(sqrt(x^2+y^2)*sin(a\ tan(x/y)+phi0)-sqrt(x^2+y^2)*sin(a\ tan(x/y))),\ U0y=sqrt(x^2+y^2)*cos(a\ tan(x/y)+phi0)-sqrt(x^2+y^2)*cos(a\ tan(x/y))),$$ the direction of displacements was clockwise along the z-axis.

C—Defining the contact: the contact pair in 4) was referred, the friction was set, the exponential dynamic Coulomb friction was used to calculate, and the static friction coefficient was 0.2.

D—Symmetrical plane setting: in this method, half of the symmetrical fastener was taken along the symmetrical plane to build a model, and the model plane that coincides with the symmetrical plane (as shown in FIG. 10b) was set as the symmetrical boundary.

7) Defining material parameters. the operations related to "Material" was used to set the material parameters of the geometric domains of the fastener and fixed plate in the model. The material parameters defined in this embodiment are shown in Table 1 mentioned above.

8) Dividing a mesh. FIG. 11b and FIG. 12b are the finite element mesh models used in this embodiment, and the mesh division steps are as follows:

the mesh type of the fastener geometry domain was specified as "Free tetrahedral mesh", and the free tetrahedral mesh size was "customized": "refine" the mesh of the contact surface between the fastener and the fixed plate, and finally, "Build All" generated finite element meshes shown in FIG. 11b and FIG. 12b.

(3) Solving and Post-Processing

1) Steady state study.

A—Setting the solver: the range of the "steady state" study was set: 10^range(−1, 0.1, −0.5)*2 10^range(−0.45, 0.025, 0)*2, 10^range(−1, 0.005, 0)*2.

B—Calculation: after the setting was completed, the finite element model was solved, and the calculation process was realized by the built-in algorithm of COMSOL software. The process of solving involves surface friction, and the surface friction is based on the following theoretical equations:

$$f=\mu_1 \times N\ F=\mu_2 \times N$$

wherein, f is the friction force, $\mu 1$ is the dynamic friction factor, N is the positive pressure; F is the maximum static friction force of the positive pressure, and $\mu 2$ is the static friction factor.

2) Post-processing. The results that can be viewed through post-processing are as follows.

A—"Three dimensional drawing group" was added, "Body" draw was used, the expression solid.mises was input, the viewing parameter values were modified, and the stress distribution diagrams on the fastener during the pulling-out process were drawn, as shown in FIG. 13b and FIG. 14b. It can be seen from the figures that the design of the fastener meets the strength requirements, and there will be no fracture failure, but some parts such as the root of the fastener (the connecting portion between the fins and the connecting column) need to be strengthened.

Figure 15B:
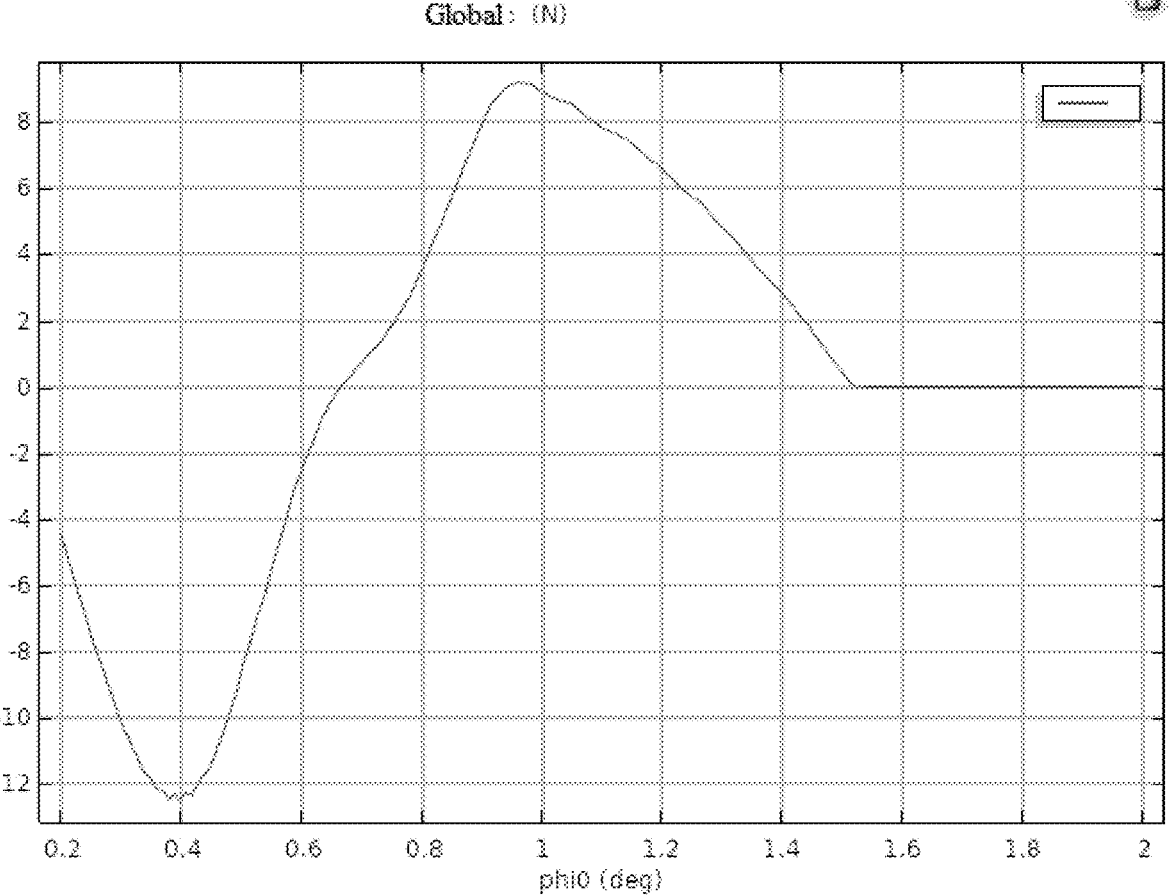

B—"One-dimensional drawing group" was added, "Global" draw was used, and the relationship between the reaction force Y and the pulling-out displacement was drawn, as shown in FIG. 15b. The simulation results show that the design requirements are met.

3) According to the stress distribution diagram, the parameters of the fastener of the loudspeaker frame, such as size, material, etc., were adjusted.

The above describes and shows the basic principles, basic block diagrams, audio flow diagrams, algorithms and advantages of the present disclosure. The embodiments described above are only for illustrating the technical concepts and features of the present disclosure, and are preferable embodiments.

We claim:

1. A loudspeaker frame, comprising a frame body, and a fastener for mounting the frame body in an application scenario;

wherein the fastener comprises:

a connecting column having a proximal end being directly or indirectly connected to the frame body and a distal end; and fins arranged in a pair and respectively located on two sides of the connecting column, wherein each of the fins has a proximal end and a distal end, and distance between the proximal end of each of the fins and the frame body is less than distance between the distal end of each of the fins and the frame body;

wherein the distal end of each of the fins is connected to the distal end of the connecting column, a gap is formed between the proximal end of each of the fins and the connecting column, and each of the fins has elasticity so as to allow the fin to draw close to the connecting column after being pressed, and wherein an upper surface of each of the fins is provided with a snapping-in guiding slope for facilitating a snapping-in of the fastener, and the snapping-in guiding slope is gradually inclined upward from the distal end to the proximal end of the fin.

2. The loudspeaker frame according to claim 1, wherein an upper surface of each of the fins is further provided with a pulling-out guiding slope, and the pulling-out guiding slope is gradually inclined downward from the distal end to the proximal end of the fin.

3. The loudspeaker frame according to claim 2, wherein an inclination angle of the snapping-in guiding slope is smaller than an inclination angle of the pulling-out guiding slope.

4. The loudspeaker frame according to claim 1, wherein each of the fins is in a shape of a sheet with a middle portion bent upwards as a whole.

5. The loudspeaker frame according to claim 1, wherein the proximal end of each of the fins is located on one side of the connecting column when not being compressed, and the proximal end of each of the fins is flush with the connecting column or is located on the other side of the connecting column after being compressed.

6. The loudspeaker frame according to claim 1, wherein the fastener is one and the fins are two, and the two fins are symmetrically arranged.

7. The loudspeaker frame according to claim 1, wherein the fastener is integrally formed with plastic.

8. The loudspeaker frame according to claim 1, wherein the proximal end of the connecting column is fixedly connected to the frame body.

9. A loudspeaker, comprising a loudspeaker frame according to claim 1.

10. A method of simulation analysis for mounting a loudspeaker frame according to claim 1, comprising snapping-in analysis steps and pulling-out analysis steps;

wherein the snapping-in analysis steps comprise:

A—building a first geometric model according to the fastener of the loudspeaker frame and a structure of its mounting scenario, where the first geometric model is a geometric model in which the fastener is snapped in the mounting scenario;

B—building a first finite element model based on the first geometric model; and

C—solving and post-processing the first finite element model to obtain stress distribution during the fastener being snapped in the mounting scenario;

the pulling-out analysis steps comprises:

a—building a second geometric model according to the fastener and the structure of its mounting scenario, where the second geometric model is a geometric model in which the fastener is pulled out from the mounting scenario;

b—building a second finite element model based on the second geometric model; and c—solving and post-processing the second finite element model to obtain stress distribution during the fastener being pulled out from the mounting scenario;

wherein, in the steps C and the step c, a surface friction is used when solving, and the surface friction is based on the following theoretical equations: $f=\mu_1 \times N$; $F=\mu_2 \times N$; wherein, f is friction force, $\mu_1$ is dynamic friction factor, N is positive pressure; F is maximum static friction force of the positive pressure, and $\mu_2$ is static friction factor;

the method further comprises adjusting parameters of the fastener of the loudspeaker frame according to the snapping-in analysis steps and the pulling-out analysis steps.

11. The method according to claim 10, wherein the step C and step c respectively comprise:

setting a range of steady state study: the range of the first finite element model is 10^range (−1, 0.1, −0.5)*2 10^range (−0.45, 0.025, 0)*2, the range of the second finite element model is 10^range (−1, 0.005, 0)*2;

solving the first finite element model and the second finite element model based on the following theoretical equations:

$[M]\{\ddot{X}\}+[C]\{\dot{X}\}+[K]\{X\}=\{F\}$; wherein, [M] is mass matrix, [C] is damping matrix, [K] is static stiffness matrix, $\{\ddot{X}\}$ is nodal acceleration vector, $\{\dot{X}\}$ is nodal velocity vector, $\{X\}$ is nodal displacement vector, $\{F\}$ is excitation load vector; and performing image processing or list display on results of solving the first finite element model and the second finite element model.

12. The method according to claim 10, wherein the step B specifically comprises:

B1—setting spatial dimension to three dimensions, selecting solid mechanics in structural mechanics for physical interface, and selecting steady state for study type;

B2—importing the first geometric model to form a union;

B3—defining parameters of movement mode;

B4—defining integral and contact pairs;

B5—setting material of the fastener and the mounting scenario in the first geometric model;

B6—setting boundary conditions and constraints;

B7—defining material parameters;

B8—dividing mesh to form the first finite element model.

13. The method according to claim 10, wherein the step b specifically comprises:

b1—setting spatial dimension to three dimensions, selecting solid mechanics in structural mechanics for physical interface, and selecting steady state for study type;

b2—importing the second geometric model to form a union;

b3—defining parameters of movement mode;

b4—defining integral and contact pairs;

b5—setting material of the fastener and the mounting scenario in the second geometric model;

b6—setting boundary conditions and constraints;

b7—defining material parameters;

b8—dividing mesh to form the second finite element model.

14. The method according to claim 12, wherein, said defining parameters of movement mode is specifically: rotation radius rr=0.252095 [m], initial angle phi0=(a sin (0.007936794664 [m]/rr)); and/or said defining integral and contact pairs is specifically: integrating acting surface of an external force during snapping in or pulling out, and setting positions of the fastener and the mounting scenario where may come into contact during snapping in or pulling out as a pair of contact pairs; and/or the material of the fastener and the mounting scenario are specifically: the material of the fastener is polypropylene plastic, and the material of the mounting scenario is steel; and/or said setting boundary conditions and constraints is specifically: setting the boundary of the mounting scenario as a fixed constraint boundary, specifying a displacement on the fastener, using the contact pairs to set friction, building the first geometric model by taking half of the fastener along its symmetry plane, and setting model face that coincides with the symmetry plane as a symmetry boundary; and/or said defining material parameters is specifically: setting Young's modulus, density and Poisson's ratio of the material; and/or said dividing mesh is specifically: adopting a free tetrahedral mesh type and setting a customized mesh for the contact surface to refine the mesh.

15. The method according to claim 10, wherein the mounting scenario is a mounting plate.

* * * * *